United States Patent [19]

Kage

[11] Patent Number: 4,630,290

[45] Date of Patent: Dec. 16, 1986

[54] SQUELCH SIGNAL GENERATOR CAPABLE OF GENERATING A SQUELCH SIGNAL WITH A HIGH RELIABILITY

[75] Inventor: Kouzou Kage, Tokyo, Japan

[73] Assignee: NEC Corporation, Japan

[21] Appl. No.: 672,346

[22] Filed: Nov. 16, 1984

[30] Foreign Application Priority Data

Nov. 18, 1983 [JP] Japan ............................... 58-217456
Nov. 18, 1983 [JP] Japan ............................... 58-217457

[51] Int. Cl.⁴ ............................................. H04B 1/10
[52] U.S. Cl. ..................................... 375/104; 455/222
[58] Field of Search .................. 375/104, 101, 58, 39, 375/100; 455/218, 222, 225; 328/165

[56] References Cited

U.S. PATENT DOCUMENTS 3,721,959 3/1973 George ................................. 375/100
4,342,120 7/1982 Settlemire et al. .................. 455/225

Primary Examiner—Robert L. Griffin
Assistant Examiner—M. Huseman
Attorney, Agent, or Firm—Laff, Whitesel, Conte & Saret

[57] ABSTRACT

A squelch signal generator is responsive to a digital input signal (IN) which causes a display of an eye pattern in an oscillascope. The pattern has at least one eye at each time instant appearing at a predetermined period. A squelch threshold level ($V_S$) is preselected outside of a predetermined one of uppermost and lowermost cross-points of at least one eye. The squelch comparator compares an input level of the input signal with the first squelch threshold level to produce a resultant signal which is representative of a first result of the comparison. The resultant signal is processed at each time instant by a processing circuit into a squelch signal when the input signal is classified into an undesired signal. An additional squelch threshold level may be preselected outside of the other of the uppermost and the lowermost cross-points.

4 Claims, 3 Drawing Figures

SQUELCH SIGNAL GENERATOR CAPABLE OF GENERATING A SQUELCH SIGNAL WITH A HIGH RELIABILITY

BACKGROUND OF THE INVENTION

This invention relates to a squelch signal generator for use in a radio receiver responsive to a radio signal carrying an input signal of a baseband. It is noted here throughout the instant specification that the input signal is a digital signal, such as a binary signal, a ternary signal, or the like.

In general, a squelch signal generator of the type described is put into operation to classify such an input signal into a desired signal and an undesired signal and to produce a squelch signal when the input signal is classified into the undesired signal. The desired signal may be derived from a specific radio channel assigned to a radio receiver including the squelch signal generator in question while the undesired signal falls within the other radio channels except the specific radio channel.

A conventional squelch signal generator detects a field intensity of the specific radio channel and produces a squelch signal when the field intensity is lower than a preselected intensity which may be called a squelch level. Another conventional squelch signal generator detects a noise level interspersed in the other channels and produces a squelch signal when the noise level is higher than a preselected noise level which may also be called a squelch level.

However, both of the conventional squelch signal generators are disadvantageous in that a malfunction inevitably takes place due to interference and an intermodulation noise which result from the other channels. In other words, the squelch signal is wrongly interrupted with each of the conventional squelch signal generators despite the fact that the desired signal is not received. This results in occurrence of noise on reproduction of the input signal.

In addition, each squelch level fluctuates due to a variation of temperature and aging in the conventional squelch signal generators. The fluctuation of the squelch signal level brings about a variation of a bit error rate or symbol error rate to be detected by the squelch signal generators. This means that the squelch signal is not produced from either of the conventional squelch signal generators when the input signal has a high bit error or a high symbol error rate. The bit error rate and the symbol error rate will collectively be named an error rate.

SUMMARY OF THE INVENTION

It is an object of this invention to provide a squelch signal generator which is capable of generating a squelch signal with a high reliability only when an input signal is classified into an undesired one.

It is another object of this invention to provide a squelch signal generator of the type described, which is strong against a variation of temperature and against aging.

It is still another object of this invention to provide a squelch signal generator of the type described, wherein the squelch signal is produced even when the input signal has a high error rate.

A squelch signal generator to which this invention is applicable is responsive to an input signal having an input level and classifiable into a desired and an undesired signal and generates a squelch signal when the input signal is classifiable into the undesired signal. The input signal causes a display of an eye pattern on an oscilloscope which has at least one eye when the input signal is classifiable into the desired signal. At least one eye appears at a predetermined period and has a pair of cross-points of a high and a low level at a time instant defined by the predetermined period. According to this invention, the squelch signal generator comprises first threshold signal producing means for producing a first threshold signal of a first threshold level which is preselected outside of a predetermined one of the high and the low levels relative to at least one eye, first comparing means responsive to the input and the first threshold signals for comparing the input level with the first threshold level to produce a first result signal representative of whether or not the input level is laid outside of the first threshold level relative to at least one eye, and processing means coupled to the first comparing means for successively processing the first result signal at the time instant to discriminate between the desired and the undesired signals and to produce the squelch signal when the undesired signal is detected.

DESCRIPTION OF THE PREFERRED EMBODIMENTS

Figure 1:
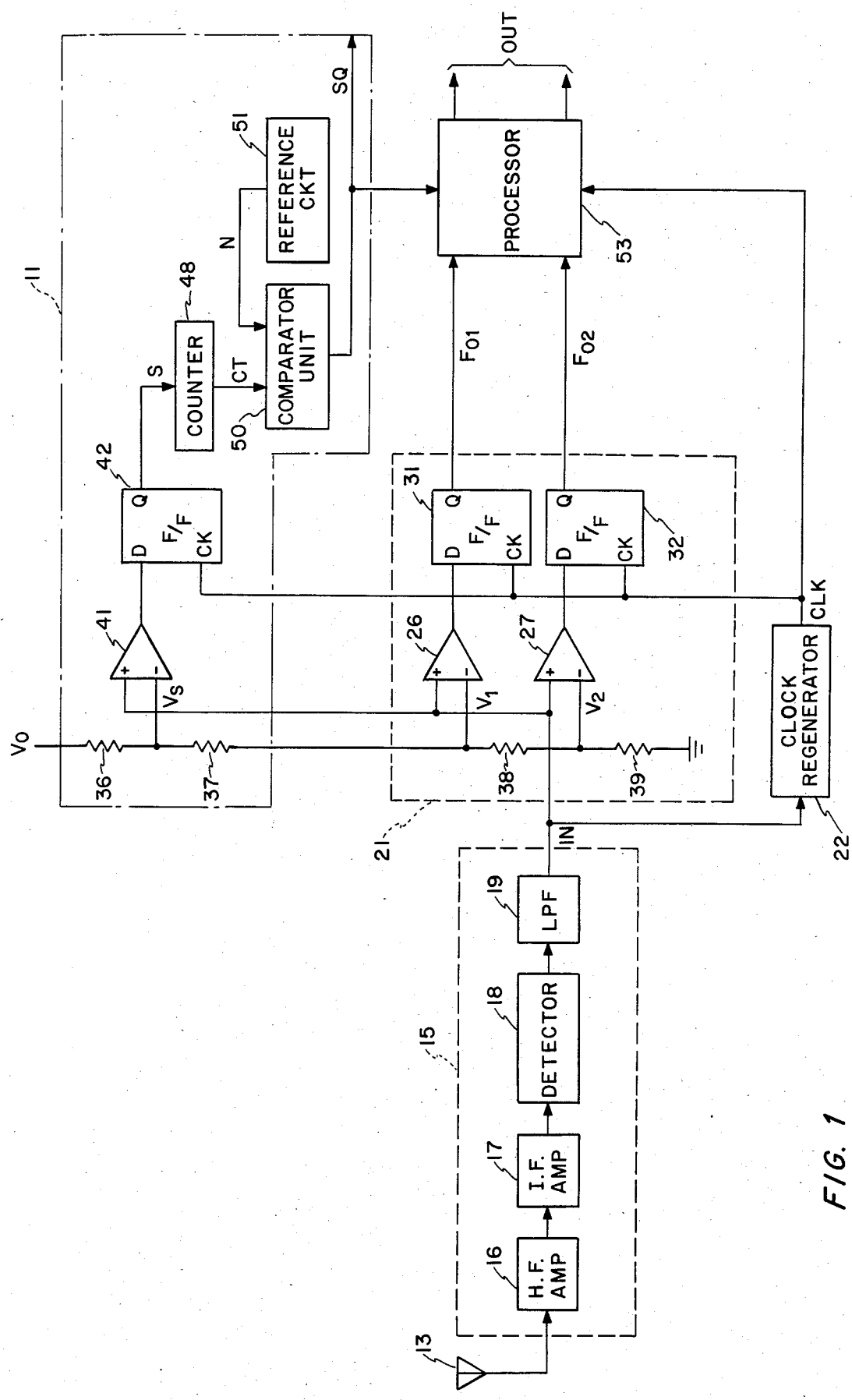
FIG. 1 is a block diagram of a receiver comprising a squelch signal generator according to a first embodiment of this invention.

Referring to FIG. 1, a squelch signal generator 11 according to a first embodiment of this invention is for use in a receiver responsive to a radio signal carrying an input signal IN which will later be described in detail. The radio signal is sent through an antenna 13 to a reception section 15 comprising a high frequency amplifier 16, an intermediate amplifier 17, a detector 18, and a low-pass filter 19. The radio signal is processed by the reception section 15 in a usual manner to be converted into a digital signal of a baseband. The digital signal which is delivered as the input signal IN to the squelch signal generator 11, a discriminator or decision circuit 21, and a clock regenerator 22. It is assumed that the input signal IN is a ternary signal or symbol which is synchronized with a sequence of clocks having a predetermined period and which takes one of three levels. Thus, the input signal IN has an input level $V_E$.

In a manner to be described later, the squelch signal generator 11 serves to classify the input signal IN into a desired signal and an undesired signal and to produce a squelch signal SQ when the input signal IN is classified into the undesired signal.

Figure 2:
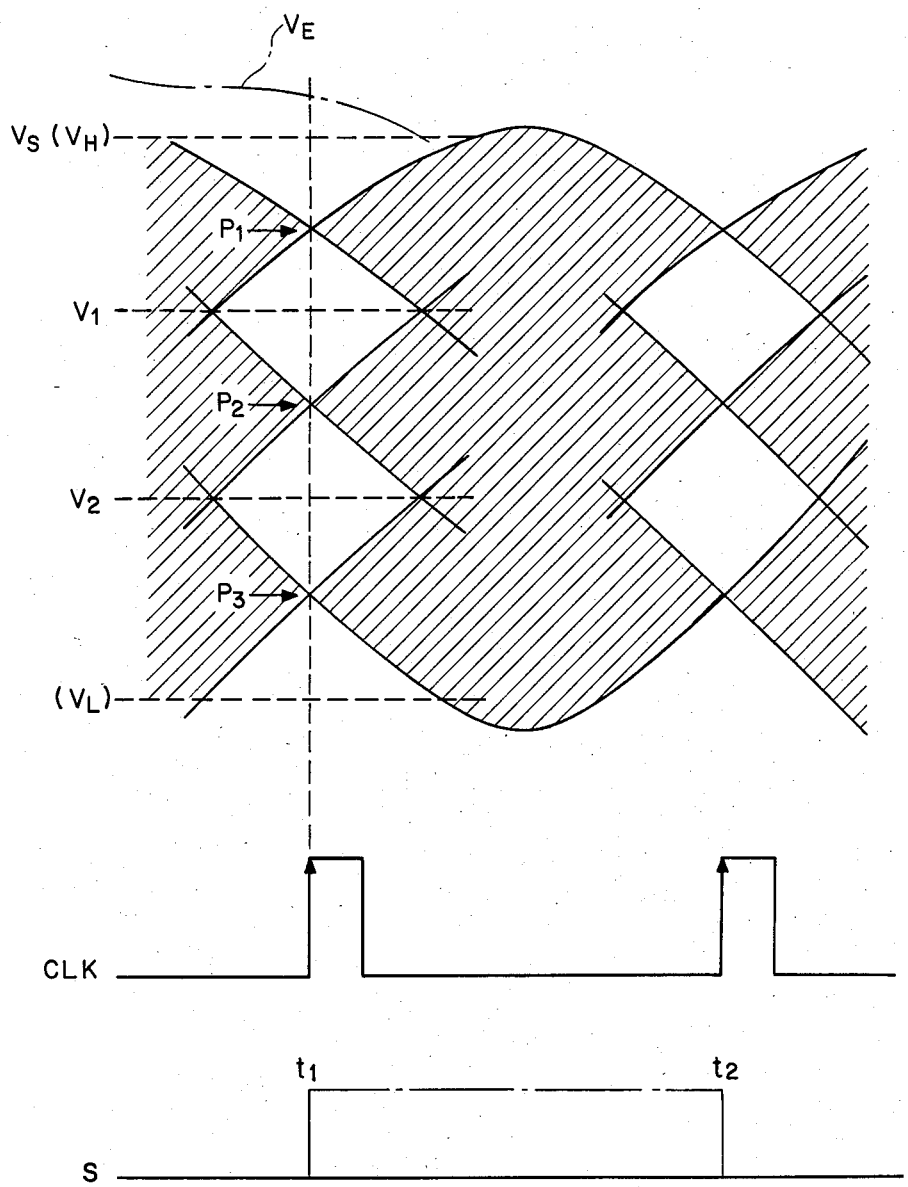
FIG. 2 is a time chart for use in describing operation of the squelch signal generator illustrated in FIG. 1.

Referring to FIG. 2, the input signal can display an eye pattern on an oscilloscope in synchronism with the clock sequence, as illustrated in the top of FIG. 2. This means that the input signal IN has a variable input level. On reception of the ternary signal, the eye pattern has two apertures or eyes at each time instant, such as $t_1$ and $t_2$, defined by the predetermined period, when the input signal IN is classified into the desired signal. When the input signal IN is classified into the undesired signal, each eye becomes narrow or is closed.

Anyway, an upper one of the two eyes has a pair of cross-points of a high and a low level depicted at $P_1$ and $P_2$, respectively, while a lower one of the two eyes has a cross-point of a high level substantially coincident with the low level ($P_2$) of the upper eye and a cross-point of a low level depicted at $P_3$. The cross-point $P_1$ may be called a highest cross-point while the cross-point $P_3$, a lowest cross-point.

Each eye has a pair of lateral cross-points at first and second intermediate levels laid between the high and the low levels thereof. In the manner well known in the art and will later be described, detection is made at the first and the second intermediate levels to discriminate each level of the ternary signal from one another.

In FIGS. 1 and 2, the clock regenerator 22 regenerates the clock sequence depicted at CLK in response to the input signal IN. Each of the regenerated clocks CLK has a leading edge coincident with the cross-points $P_1$ through $P_3$ of the eyes, as illustrated along the second line of FIG. 2, and is repeated at the predetermined period. Each of the regenerated clocks CLK are sent to the squelch signal generator 11 and the discriminator 21.

The discriminator 21 comprises first and second detection comparators 26 and 27 supplied with first and second detection threshold levels $V_1$ and $V_2$. The first and the second detection threshold levels $V_1$ and $V_2$ are equal to the first and the second intermediate levels, respectively, as shown in FIG. 2.

The first detection comparator 26 delivers a logic "1" level to a first detection flip-flop 31 when the input level $V_E$ is higher than the first detection threshold level $V_1$. Otherwise, a logic "0" level is sent from the first detection comparator 26 to the first detection flip-flop 31.

Likewise, the second detection comparator 27 sends the logic "1" level to a second detection flip-flop 32 when the input level $V_E$ is higher than the second detection threshold level $V_2$. Otherwise, the logic "0" level is sent from the second detection comparator 27 to the second detection flip-flop 32.

Each of the logic "1" and the logic "0" level signals is kept in the first and the second detection flip-flops 31 and 32 in timed relation to the regenerated clocks CLK. As a result, flip-flop output signals are produced as first and second flip-flop output signals $FO_1$ and $FO_2$ from the first and the second detection flip-flops 31 and 32, respectively. As readily understood, both of the flip-flop output signals $FO_1$ and $FO_2$ can specify each level of the ternary signal. Thus, the input signal IN can be discriminated by the discriminator 21.

The squelch signal generator 11 comprises a series circuit of first, second, third, and fourth resistors 36, 37, 38, and 39 which serves to divide an electric voltage $V_0$. The series circuit produces a squelch threshold signal of a squelch threshold level $V_S$ which may be preselected higher than the highest cross-point $P_1$, as shown in FIG. 2. The illustrated series circuit also delivers the first and the second detection threshold levels $V_1$ and $V_2$ to the first and the second detection comparators 26 and 27, respectively. Anyway, the series circuit of the first through the fourth resistors 36 to 39 will be referred to as a threshold circuit for providing the squelch threshold signal.

The squelch threshold signal is given to a squelch comparator 41 supplied with the input signal IN. The squelch comparator 41 compares the input level $V_E$ with the squelch threshold level $V_S$ to produce the logic "1" level as a comparator output signal when the input level is higher than the squelch threshold level $V_S$. Otherwise, the logic "0" level is produced as the comparator output signal. The comparator output signal is representative of whether or not the input level $V_E$ is laid outside of the squelch threshold level $V_S$ relative to the eyes, namely, whether or not the input level $V_E$ is higher than the squelch threshold level $V_S$. At any rate, the comparator output signal represents a result of comparison between the input and the squelch threshold levels $V_E$ and $V_S$ and will be called a result signal when the comparator output signal takes the logic "1" level.

The comparator output signal is timed by each of the regenerated clocks CLK and kept in a squelch flip-flop 42. As a result, a flip-flop output signal S of the squelch flip-flop 42 is produced as shown along the bottom line of FIG. 2. The flip-flop output signal S of the squelch flip-flop 42 is in correspondence to the comparator output signal and variable at each time instant, such as $t_1$ or $t_2$.

A counter 48 counts occurrences of the flip-flop output signal S to supply a comparator unit 50 with a count signal representative of a count CT of the occurrences. A reference circuit 51 supplies the comparator unit 50 with a reference signal representative of a reference number N which may be, for example, 100.

The comparator unit 50 compares the count signal (CT) with the reference signal (N) and produces the squelch signal SQ when the count CT exceeds the reference number N. The comparator unit 50 is thus operable to produce the squelch signal SQ and may therefore be named a squelch signal producing circuit. A combination of the squelch flip-flop 42, the counter 48, the comparator unit 50, and the reference circuit 51 processes the comparator output signal into the squelch signal SQ when the count CT exceeds the reference number N. This means that a decision is made between the desired and the undesired signals with reference to the occurrences of the result signal and that the squelch signal SQ appears on the decision of the undesired signal. As readily understood from the above, the combination of the counter 48, the comparator unit 50, and the reference circuit 51 serves as a part of the squelch signal generator 11.

The first and the second flip-flop output signals $FO_1$ and $FO_2$ are processed by a processor 53 into a set of output signals OUT, such as commands and data, in a usual manner. In this event, the squelch signal SQ may be referenced by the processor 53.

Operation of the squelch signal generator 11 will be described more in detail. A symbol error rate $P_{se}$ increases in the input signal IN with a reduction of a field intensity of the radio signal or with an increase of a random noise. Occurrences of the flip-flop output signal S becomes frequent as the symbol error rate increases in the input signal IN.

It is to be mentioned here that a symbol error appears when the input level $V_E$ is reduced as compared with each of the first and the second detection threshold levels $V_1$ and $V_2$ (FIG. 2) in spite of the fact that the input level $V_E$ is to become equal to the level of the highest cross-point $P_1$. It may be said that such a reduction of the input level $V_E$ also brings about an increase of the input level $V_E$ at the same probability when the input signal IN successively appears under the same conditions. This suggests that the symbol error rate can be measured by occurrences of the increase of the input level $V_E$, although occurrences of the reduction of the input level $V_E$ can not be measured.

Under the circumstances, a difference between the squelch threshold level $V_S$ and the level of the highest cross-point $P_1$ is rendered substantially equal to a difference between the level of the highest cross-point $P_1$ and the first detection threshold level $V_1$. In addition, let the input level $V_E$ become lower than the first detection threshold level $V_1$ at a first probability $P_{UD}$ and become higher than the squelch threshold level $V_S$ at a second probability $P_{OV}$. The first probability $P_{UD}$ is equal to the symbol error rate $P_{se}$ and to the second probability $P_{OV}$, as readily understood from the above. It may be said that the symbol error at the cross-points $P_2$ and $P_3$ occurs at the same symbol error rate $P_{se}$ as the highest cross-point $P_1$.

In general, it is concluded that the symbol error rate $P_{se}$ is proportional to the second probability $P_{OV}$. Therefore, the symbol error rate $P_{se}$ is given by:

$$P_{se} = kP_{OV}, \qquad (1)$$

where k represents a constant. Equation (1) shows that it is possible to know the symbol error rate $P_{se}$ by monitoring the second probability $P_{OV}$ within a predetermined duration.

In FIG. 1, the second probability $P_{OV}$ is indicated by the reference circuit 51 in the form of the reference number N. When the count CT of occurrences of the result signal S reaches the reference number N as a result of a reduction of the symbol error rate $P_{se}$, the squelch signal SQ is produced from the comparator unit 50. This means that the second probability $P_{OV}$ is monitored by measuring the count CT of occurrences of the result signal S.

The squelch threshold level $V_S$ may be preselected lower than the level of the lowermost cross point $P_3$ (FIG. 2). In this case, measurement is made about a frequency of occurrences of becoming lower than the squelch threshold level $V_S$. Such measurement is possible by monitoring a flip-flop output signal appearing each time when the input level $V_E$ becomes lower than the squelch threshold level $V_S$. Anyway, the squelch comparator 41 and the squelch flip-flop 42 serve to detect whether or not the input level is preselected outside of the squelch threshold level $V_S$ relative to the eyes.

Figure 3:
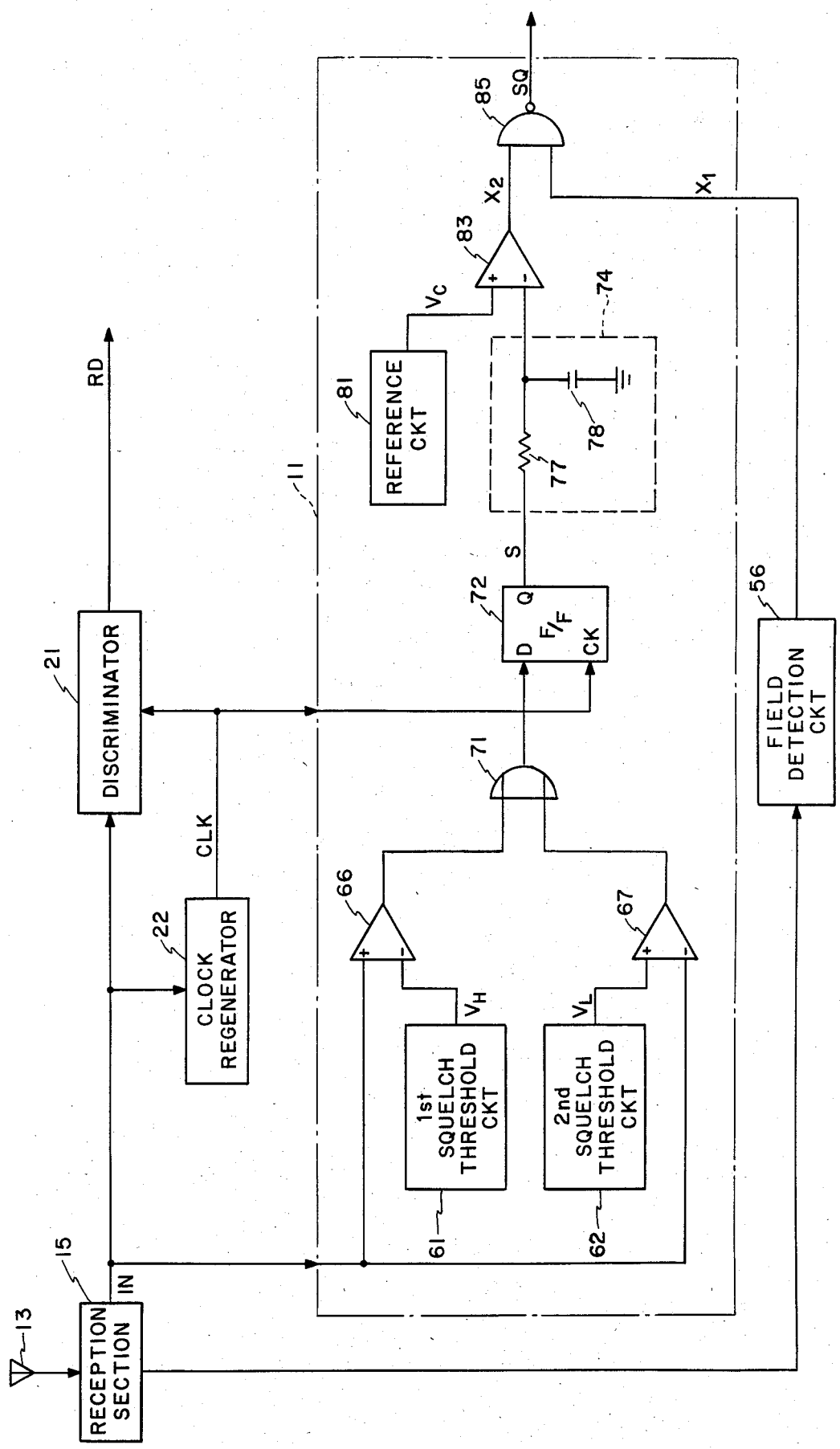
FIG. 3 is a block diagram of another receiver comprising a squelch signal generator according to a second embodiment of this invention.

Referring to FIG. 3, a squelch signal generator 11 according to a second embodiment of this invention is for use in a receiver comprising similar parts and signals designated by like reference numerals and symbols. The illustrated squelch signal generator 11 is combined with a field detection circuit 56 for detecting a field intensity related to a radio signal carrying the input signal IN. The field detection circuit 56 may detect either the field intensity of a specific radio channel assigned to the receiver or a level of a noise included in any other radio channel than the specific radio channel. The field detection circuit 56 is operable in response to an intermediate frequency signal produced by the intermediate frequency amplifier 17 (FIG. 1) of the reception section 15 in the manner known in the art.

It is assumed that the illustrated field detection circuit 56 produces the logic "1" level as a detection output signal $X_1$ when the radio signal carries the input signal IN received by the receiver in question. Otherwise, the logic "0" level is produced as the detection output signal $X_1$ from the field detection circuit 56. Thus, the detection output signal $X_1$ is representative of reception and non-reception of the radio signal.

The input signal IN is delivered from the reception section 15 to the squelch signal generator 11, the discriminator 21, and the clock regenerator 22. The discriminator 21 discriminates each level of the input signal IN from one another in synchronism with the regenerated clocks CLK to produce a discriminated signal RD which is equivalent to a combination of the first and the second flip-flop output signals $FO_1$ and $FO_2$ (FIG. 1).

Referring back to FIG. 2 together with FIG. 3, the squelch signal generator 11 comprises a first threshold circuit 61 for producing a first squelch threshold signal of a first squelch threshold level $V_H$ which may be equal to the squelch threshold level $V_S$ (FIG. 1). Therefore, the first squelch threshold level $V_H$ is preselected outside of the highest cross-point $P_1$ (FIG. 2).

A second threshold circuit 62 produces a second squelch threshold signal of a second squelch threshold level $V_L$ which is preselected lower than the level of the lowest cross-point $P_3$. A difference of the second threshold level $V_L$ and the level of the lowest cross-point $P_3$ may be equal to that between the first squelch threshold level $V_H$ and the level of the highest cross-point $P_1$.

A first squelch comparator 66 is equivalent to the squelch comparator 41 and has a positive and a negative terminal supplied with the input signal IN and the first squelch threshold signal, respectively, and produces a first comparator output signal representative of a first result of comparison between the input and the first squelch threshold levels $V_E$ and $V_H$. With this structure, the first comparator output signal takes either the logic "1" or the logic "0" level when the input level $V_E$ is higher or not higher than the first squelch threshold level $V_H$, respectively. The first comparator output signal may be called a first result signal when the first comparator output signal takes the logic "1" level.

A second squelch comparator 67 has a positive and a negative terminal supplied with the second squelch threshold signal and the input signal IN, respectively, and produces a second comparator output signal representative of a second result of comparison between the second squelch threshold level $V_L$ and the input level $V_E$. With the second squelch comparator 67, the second comparator output signal takes either the logic "1" level or the logic "0" level when the input level $V_E$ is lower or not lower than the second squelch threshold level $V_L$, respectively.

The first and the second comparator output signals are sent to an OR gate 71 and thence to a flip-flop 72 which is operable in response to the regenerated clocks CLK. As a result, a combination of the OR gate 71 and the flip-flop 72 combines the first and the second result signals at each time instant, such as $t_1$ or $t_2$, into a combined result signal S (the same reference symbol being used).

The combined result signal S is successively supplied to a low-pass filter 74 for producing a filter output signal. The low-pass filter 74 comprises a resistor 77 and a capacitor 78, as illustrated in FIG. 3. The filter output signal takes a low level during a low frequency of occurrences of the combined result signal and becomes a high level with an increase of the frequency of occurrences of the combined result signal. In other words, the filter output level is raised up in dependency on irregularity of the input signal IN. Thus, the low-pass filter 74 serves to measure occurrences of the combined result signal. The filter output signal is representative of a result of measurement and may be called a measurement signal which has a measurement level dependent on the frequency of occurrences of the combined result signal.

A reference circuit 81 produces a reference signal representative of a reference level $V_C$. A third squelch comparator 83 has a positive and a negative terminal supplied with the reference level $V_C$ and the level of the filter output signal, respectively, and produces either the logic "1" level or the logic "0" level as a third comparator output signal $X_2$ when the level of the filter output signal is lower or not lower than the reference level $V_C$, respectively. Therefore, the third comparator output signal $X_2$ takes the logic "1" level and the logic "0" level when the input signal IN appears with a high regularity and with a low regularity, respectively.

Responsive to the detection output signal $X_1$ and the third comparator output signal $X_2$, a NAND gate 85 produces a squelch signal SQ specified by the logic "1" level. The squelch signal SQ appears from the NAND gate 85 even when the detection output signal $X_1$ takes the logic "1" level, if the third comparator output signal $X_2$ takes the logic "1" level. Such operation is effective to avoid a malfunction when serious interference or intermodulation noise takes place in the specific radio channel. This is because the eyes are closed in the eye pattern on occurrence of such serious interference or intermodulation noise even when the field intensity of the specific radio channel is strong enough to render the detection output signal $X_1$ into the logic "1" level.

With this structure, reception and non-reception of the input signal IN is preferably detected without any malfunction. Anyway, a combination of the OR gate 71, the combination flip-flop 72, the low-pass filter 74, the reference circuit 81, the third squelch comparator 83, and the NAND gate 85 serves as a processing circuit for processing the first and the second comparator output signals into the squelch signal SQ with reference to the detection output signal $X_1$.

As a rule, the field detection circuit 56 has a response time $\tau$ between 30 and 40 milliseconds. It is preferable to discriminate between the logic "1" and the logic "0" levels of the third comparator output signal $X_1$ within the response time $\tau$. Such discrimination is indicative of whether or not the eyes are opened. If the input signal IN has a bit rate of 10 Kb/s, the above-mentioned discrimination should be made from the bits of the input signal IN which are equal in number to 100 and 300. Practically, it is readily possible to judge from 100 bits whether or not the eyes are opened in the eye pattern. Accordingly, a long time is unnecessary to make such a decision.

While this invention has thus far been described in conjunction with a few embodiments thereof, it will readily be possible for those skilled in the art to put this invention into practice in various other manners. For example, the input signal IN is not limited to the ternary signal but may be a binary signal, a multilevel signal, or the like. In FIG. 1, a combination of the counter 48, the comparator unit 50, and the reference circuit 51 may be constituted by a microcomputer together with the processor 53. In FIG. 3, the OR gate 71 may be connected direct to the NAND gate 85 to directly send the first and the second comparator output signals to the NAND gate 85, although each comparator output signal is statistically processed into the squelch signal SQ in each squelch signal generator illustrated in FIGS. 1 and 3.

What is claimed is:

1. A squelch signal generator responsive to an input signal which has an input level and which input signal is classifiable into a desired or an undesired signal, said generator generating a squelch signal when said input signal is classifiable as said undesired signal, said input signal displaying on an oscilloscope an eye pattern having an eye group when said input signal is classied as said desired signal, said eye group appearing at a predetermined period and being specified by a pair of cross-points of a high and a low level at each time instant which is defined by said predetermined period, said squelch signal generator comprising:

first threshold signal producing means for producing a first threshold signal of a first threshold level which is preselected outside of a predetermined one of said high and said low levels;

first comparing means responsive to said input signal and said first threshold signal for comparing said input level with said first threshold level to produce a first resultant signal when said input level exceeds said first threshold level outside of said eye group;

clock generating means responsive to said input signal for generating a sequence of clock pulses at said each time instant appearing at every predetermined period; and processing means coupled to said first comparing means and responsive to said clock sequence for successively processing said first resultant signal at said time instant to discriminate between said desired and said undesired signals and to produce said squelch signal in response to a discrimination of said undesired signal.

2. A squelch signal generator as claimed in claim 1, wherein:

said first comparing means produces said first resultant signal whenever said input level is outside of said first threshold level relative to each eye;

said processing means comprising:

counting means coupled to said first comparing means and to said clock generating means for counting occurrences of said first result signal at said time instant to produce a count signal representative of a count of said occurrences;

reference signal producing means for producing a reference signal representative of a reference number; and squelch signal producing means responsive to said count and said reference signals for producing said squelch signal when said count exceeds said reference number.

3. In a squelch signal generator for use in combination with a detection circuit for detecting a field intensity related to a radio signal carrying said input signal to produce a detection signal representative of one of a reception and a non-reception of said radio signal; said squelch signal generator responding to an input signal which has an input level and which input signal is classifiable into a desired or an undesired signal, said generator generating a squelch signal when said input signal is classifiable into said undesired signal, said input signal drawing an eye pattern having at least one eye when said input signal is classifiable into said desired signal, said at least one eye appearing at a predetermined period and having a pair of cross-points of a high and a low level at a time instant which is defined by said predetermined period, the improvement wherein said squelch signal generator comprises:

first threshold signal producing means for producing a first threshold signal of a first threshold level which is preselected outside of a predetermined one of said high and said low levels relative to said at least one eye;

first comparing means responsive to said input signal and said first threshold signal for comparing said input level with said first threshold level to produce a first resultant signal representative of whether or not said input level is outside of said first threshold level relative to said at least one eye;

processing means coupled to said first comparing means for successively processing said first resultant signal at said time instant to discriminate between said desired and said undesired signals and to produce said squelch signal on discrimination of said undesired signal;

second threshold signal producing means for producing a second threshold signal of a second threshold level which is at a preselected level outside of the other of said high and said low levels;

second comparing means responsive to said input and to said second threshold signal for comparing said input level with said second threshold level to produce a second resultant signal when said input signal exceeds said second threshold level outside of said eye group;

said processing means comprising:

combining means coupled to said first and said second comparing means and to said clock generating means for combining said first and said second result signals into a combined resultant signal at said time instant; and squelch signal producing means for producing said squelch signal with reference to both said combined resultant signal and said detection signal.

4. A squelch signal generator as claimed in claim 3, wherein:

said squelch signal producing means comprising:

measuring means responsive to said combined resultant signal for measuring occurrences of said first and said second resultant signals to produce a measurement signal of a measurement level dependent on a frequency of said occurrences;

reference signal producing means for producing a reference signal representative of a reference level; and means responsive to said measurement signal, said reference signal, and said detection signal for producing said squelch signal in consideration of said measurement and said reference levels and said detection signal.

* * * * *